(12) United States Patent
Jang et al.

(10) Patent No.: US 8,266,080 B2
(45) Date of Patent: Sep. 11, 2012

(54) VIRTUAL MEASURING DEVICE AND METHOD

(75) Inventors: Won-Hyouk Jang, Suwon-si (KR); Joo-Hwa Lee, Suwon-si (KR); Dong-Hyun Kim, Suwon-si (KR); Hyo-Jin Han, Suwon-si (KR); Kil-Ho Ok, Suwon-si (KR); Sung-Hoon Kim, Suwon-si (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 852 days.

(21) Appl. No.: 12/354,356

(22) Filed: Jan. 15, 2009

(65) Prior Publication Data

US 2009/0307163 A1    Dec. 10, 2009

(30) Foreign Application Priority Data

Jun. 9, 2008   (KR) ........................ 10-2008-0053775

(51) Int. Cl.
*G06F 15/18* (2006.01)
(52) U.S. Cl. ........................................................ 706/14
(58) Field of Classification Search .................. 706/14, 706/62
See application file for complete search history.

(56) References Cited

U.S. PATENT DOCUMENTS 5,484,746 A * 1/1996 Ichikawa et al. ................. 117/8

FOREIGN PATENT DOCUMENTS

KR    2002-0031410    5/2002

OTHER PUBLICATIONS

Armaou et al, "Plasma enhanced chemical vapor deposition: Modeling and control", Chemical Engineering Science 54 (1999) 3305-3314.*
Edgar et al, "Automatic control in microelectronics manufacturing: Practices, challenges, and possibilities"; Department of Chemical Engineering, The University of Texas, revised Apr. 9, 1999, Automatica 36 (2000) 1567-1603.*
Evensen, "Inverse Methods and Data Assimilation in Nonlinear Ocean Models", Nansen Environmental and Remote Sensing Center, Bergen, Norway, Physica D, in press Jul. 1994.*

* cited by examiner

*Primary Examiner* — Jeffrey A Gaffin
*Assistant Examiner* — Ilya Traktovenko
(74) *Attorney, Agent, or Firm* — Lee & Morse, P.C.

(57) ABSTRACT

A virtual measuring device and a method for measuring the deposition thickness of amorphous silicon being deposited on a substrate is disclosed, where the method of measuring the deposition thickness of amorphous silicon includes predicting and adapting operations. In the predicting operation, during a process of depositing the amorphous silicon to a substrate, the deposition thickness is predicted by multiplying a predicted deposition speed to a deposition time by using a prediction model expressing a relationship between a deposition speed and a plurality of process factors that are correlated with the deposition speed obtained from the deposition thickness and the deposition time, and the predicted deposition thickness is compared with the measured deposition thickness, so that the relationship between the plurality of process factors and the deposition speed in the prediction model is compensated according to the comparison difference.

12 Claims, 15 Drawing Sheets

FIG. 3

| Parameter | Estimate | 95% CI |
|---|---|---|
| $\beta_0$ | 6.3938 | (6.2634, 6.5241) |
| $\beta_1$ | 3.0983 | (3.0031, 3.1936) |
| $\beta_2$ | 0.0815 | (0.0742, 0.0888) |
| $R^2 = 89.1\%$, $s_{Residuals} = 0.0420 [\text{Å/sec}]$ |||

FIG. 7

| Thickness measurement Interval | Thickness prediction distribution (Å) | |
|---|---|---|
| | No Adaptation | EWMA |
| 1 glasses | 1.7810 | 1.4381 |
| 5 glasses | 1.7810 | 1.4704 |
| 10 glasses | 1.7810 | 1.4882 |
| 50 glasses | 1.7810 | 1.4721 |

FIG. 9

| Thickness measurement Interval | Thickness prediction distribution (Å) | |
| --- | --- | --- |
| | No Adaptation | Kalman Filter |
| 1 glasses | 1.7810 | 1.2892 |
| 5 glasses | 1.7810 | 1.3376 |
| 10 glasses | 1.7810 | 1.3522 |
| 50 glasses | 1.7810 | 1.4253 |

VIRTUAL MEASURING DEVICE AND METHOD

CROSS-REFERENCE TO RELATED APPLICATION

This application claims priority to and the benefit of Korean Patent Application No. 2008-53775 filed in the Korean Intellectual Property Office on Jun. 9, 2008, the disclosure of which is incorporated herein by reference.

BACKGROUND OF THE INVENTION

1. Field of the Invention

Aspects of the present invention relate to a measuring device and a method for measuring the deposition thickness of α-Si on a substrate during a semiconductor fabrication process.

2. Description of the Related Art

Plasma enhanced chemical vapor deposition equipment (hereinafter, simply referred to as "PECVD" equipment) produces a substrate by depositing a buffer and amorphous silicon (hereinafter, simply referred to as "α-Si") to a glass during a low temperature polysilicon fabrication process. The deposition thickness of α-Si is closely related to a silicon crystallization process of producing polysilicon. In more detail, the deposition thickness of α-Si affects the determination or setting of energy density of an excimer laser annealing (ELA) equipment that is used as a silicon crystallization equipment. However, since the energy density of the ELA equipment is not typically determined or set according to the deposition thickness of α-Si that is deposited during a present silicon crystallization process, if the deposition thickness of α-Si of the present silicon crystallization process is different from a target deposition thickness of α-Si that was previously established in the ELA equipment for a prior silicon crystallization process, a line spot defect occurs in a substrate after the present silicon crystallization process is completed. Therefore, in order to reduce the line spot defect that is one of the main defect items that occurs during silicon crystallization processes, it is necessary to reduce the distribution of or the variance in the deposition thickness of α-Si.

When a run-to-run (RtR) control method, which is one of the advanced process control (APC) technologies that are widely used for the semiconductor fabrication process, is used with the PECVD equipment, the distribution of or variance in the deposition thickness of α-Si can be reduced compared to a typical existing semiconductor fabrication process. The RtR control method effectively removes disturbances that occur during the semiconductor fabrication process, thereby improving the process ability of the PECVD equipment. However, if there is a loss of the measured data or a delay in the measurement of the deposition thickness of α-Si, the performance of the RtR control method can be reduced.

After the silicon crystallization process is completed, a thickness ellipsometer is used to measure the deposition thickness of α-Si. In general, since at least two chambers of the PECVD equipment share a single thickness ellipsometer, time is spent to carry a substrate between the chambers and the thickness ellipsometer besides time that is spent to measure the deposition thickness of α-Si. That is, it is impossible to know the deposition thickness of α-Si in each substrate immediately after the α-Si is deposited in the PECVD equipment. Also, when the number of substrates that are provided in the PECVD equipment increases, it is impossible to measure the deposition thickness of the α-Si for every substrate.

The above information disclosed in this Background section is only for enhancement of understanding of the background of the invention and therefore contain information that is not necessarily prior art that is already known in this country to a person of ordinary skill in the art.

SUMMARY OF THE INVENTION

Aspects of the present invention have been made in an effort to provide a virtual measuring device and a method of predicting or estimating the deposition thickness of α-Si in real-time.

Aspects of the present invention include a method of predicting the deposition thickness of amorphous silicon being deposited to a substrate. The method includes: during a process of depositing the amorphous silicon to the substrate, predicting the deposition thickness by using a prediction model expressing a relationship between the deposition thickness and a plurality of process factors that are correlated with the deposition thickness of the amorphous silicon; and after measuring the deposition thickness and comparing the predicted deposition thickness with the measured deposition thickness, adapting the prediction model to compensate the relationship between the deposition thickness and the plurality of process factors according to the comparison difference.

In aspects of the present invention, the plurality of process factors may include a radio frequency power (RF power) of a deposition apparatus in a process of depositing the amorphous silicon and manufacturing the substrate, a TUNE that is an impedance control factor of a power source that supplies power to the deposition apparatus during the deposition process, and a process time (PT) of the deposition process. The prediction model may use a linear regression model.

In aspects of the present invention, the adapting of the prediction model may use exponentially weighted moving averages (EWMA) in order to include a moving average of deviations that have occurred in the prediction model. The moving average of deviations may be a term for an average of deviations that have occurred in prior predictions of the deposition thickness involving a plurality of substrates before a prediction of the deposition thickness involving a current substrate. The adapting of the prediction model may use a Kalman filter. The Kalman filter may be used by converting the prediction model into a linear discrete model.

Another aspect of the present invention includes a virtual measuring device. The virtual measuring device to predict a deposition thickness of amorphous silicon being deposited on a substrate includes: a prediction unit to predict the deposition thickness of the amorphous silicon being deposited to the substrate by using a prediction model expressing a relationship between the deposition thickness of the amorphous silicon and a plurality of process factors that are correlated with the deposition thickness of the amorphous silicon; and an adaptation unit to adapt the prediction model to compensate the relationship between the deposition thickness and the plurality of process factors according to the comparison difference, after comparing a measured deposition thickness with the predicted deposition thickness.

In aspects of the present invention, the plurality of process factors may include a radio frequency power (RF power) of a deposition apparatus in a process of depositing the amorphous silicon and manufacturing the substrate, a TUNE that is an impedance control factor of a power source that supplies power to the deposition apparatus during the deposition process, and a process time (PT) of the deposition process. The prediction model may use a linear regression model.

In aspects of the present invention, in adapting the prediction model, the adaptation unit may use exponentially weighted moving averages (EWMA) in order to include a moving average of deviations that have occurred in the prediction model. The moving average of deviations may be a term for an average of deviations that have occurred in prior predictions of the deposition thickness involving a plurality of substrates before a prediction of the deposition thickness involving a current substrate. The adaptation unit may use a Kalman filter in adapting the prediction model. The adaptation unit may convert the prediction model into a linear discrete model and use the Kalman filter.

According to an aspect of the present invention, a method of modeling a deposition thickness of amorphous silicon being deposited on a substrate in real time, includes: estimating a deposition thickness of the amorphous silicon being deposited on the substrate by using an equation expressing a relationship between the deposition thickness and a plurality of process factors of a deposition apparatus used during the deposition of amorphous silicon; measuring a deposited thickness of the amorphous silicon over a designated sheet interval and comparing the measured deposited thickness with the estimated deposition thickness to generate a difference data; and modifying the equation with additional terms for the equation based on the generated difference data so that subsequent difference data is within a predetermined range.

According to an aspect of the present invention, an apparatus to model a deposition thickness of amorphous silicon being deposited on a substrate in real time, includes: a predictor to estimate a deposition thickness of the amorphous silicon being deposited on the substrate by using an equation expressing a relationship between the deposition thickness and a plurality of process factors of a deposition apparatus used during the deposition of amorphous silicon; a measurer to measure a deposited thickness of the amorphous silicon over a designated sheet interval for use in comparing the measured deposited thickness with the estimated deposition thickness to generate a difference data; and an adapter to modify the equation with additional terms for the equation based on the generated difference data so that subsequent difference data is within a predetermined range.

As described above, aspects of the present invention provide a virtual measuring device and method capable of predicting the deposition thickness of α-Si in real-time.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which:

FIG. 3 is a diagram illustrating model parameter estimation results of a prediction model according to an aspect of the present invention.

FIG. 7 is a table illustrating the thickness prediction distribution of a virtual measuring device with respect to the prediction results and the deposition thickness shown in an aspect of the present invention of FIGS. 6A-6H.

FIG. 9 is a table illustrating the thickness prediction distribution of a virtual measuring device with respect to the prediction results of the deposition thickness shown in FIGS. 8A to 8H.

DETAILED DESCRIPTION OF THE EMBODIMENTS

Figure 1:
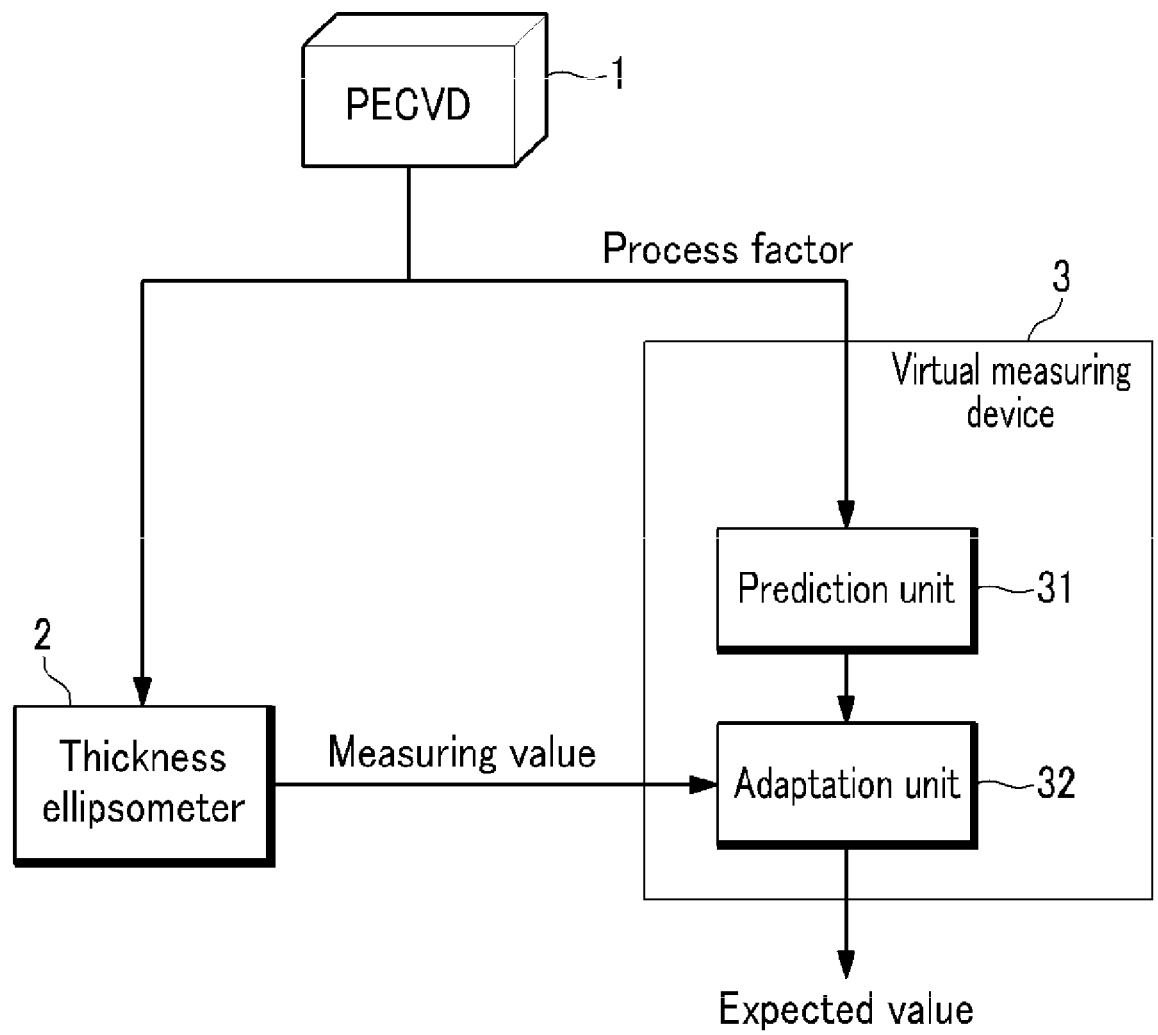
FIG. 1 is a block diagram illustrating a virtual measuring device and its use according to an aspect of the present invention.

Reference will now be made in detail to aspects of the present invention, examples of which are illustrated in the accompanying drawings, wherein like reference numerals refer to the like elements throughout. The aspects are described below in order to explain the present invention by referring to the figures.

In the following detailed description, only certain aspects of the present invention have been shown and described, simply by way of illustration. As those skilled in the art would realize, the described aspects may be modified in various different ways, all without departing from the spirit or scope of the present invention. Accordingly, the drawings and description are to be regarded as illustrative in nature and not restrictive.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise", and variations such as "comprises" and "comprising", will be understood to imply the inclusion of stated elements but not the exclusion of any other elements.

In aspects of the present invention discussed below, a number of glasses may also refer to a number of substrates and vice versa.

FIG. 1 is a block diagram illustrating an application of a virtual measuring device 3 and its use according to an aspect of the present invention. As shown in FIG. 1, a thickness ellipsometer 2 measures the deposition thickness of α-Si of a substrate (not shown) produced by a plasma enhanced chemical vapor deposition (PECVD) equipment 1. The virtual measuring device 3 configures or selects a prediction model used to estimate the deposition thickness of α-Si of the substrate, by using at least one of a plurality of factors, that can be measured in real-time during a deposition process of the α-Si performed by the PECVD equipment 1, as an independent parameter, corrects an error or deviation in the prediction model caused by characteristic variations (also referred to as variations in characteristics) in the process (i.e. deposition process) that occurs over time by using the deposition thickness of α-Si of the substrate measured by the thickness ellipsometer 2. The prediction model refers to a model that indicates (or expresses) a relationship between a process factor that is correlated with the deposition speed of α-Si that is deposited to the substrate among factors that can be measured in real-time, and the deposition speed of the α-Si during the operation of the PECVD equipment 1.

The factors that can be measured include various types of radio frequency (RF) power monitoring information, a process time (hereinafter, simply referred to as "PT"), and a chamber temperature. The factors that can be measured in real-time are the RF power monitoring information of the PECVD equipment 1. The RF power monitoring information includes RF power Vpp (hereinafter, "VPP"), RF forward power, RF reflective power, and an impedance control factor.

The impedance control factor is used in view of the fact that impedance of a power source that supplies power to the PECVD equipment 1 needs to be matched with that of the PECVD equipment 1. Since the impedance of the PECVD equipment 1 varies according to time, the impedance of the power source that needs to be matched with the impedance of the PECVD equipment 1 also varies with time. The impedance control factor is a factor used to control the impedance of the power source according to the impedance variation of the PECVD equipment 1. Hereinafter, the impedance control factor of the power source according to aspects of the present invention is referred to as "TUNE".

In an aspect of the present invention, a correction of the error or deviation of the prediction model caused by the variation of the characteristics of the process according to the elapse of time is referred to as an adaptation. Accordingly, adaptation includes a process of correcting or modifying the correlations between the deposition speed of the α-Si and the process factor, that is established as the independent parameter of the prediction model among the factors that can be measured, in the prediction model. In aspects of the present invention, the variation of the characteristics of the process, or characteristics variations refers to changes in the process factors. In aspects of the present invention, the changes in the process factors occur over time.

In the virtual measuring device 3 according to an aspect of the present invention, the prediction model is established, predefined, or selected. The virtual measuring device 3 includes a prediction unit 31 and an adaptation unit 32. The prediction unit 31 predicts (or estimates) a deposition speed of the α-Si by using the prediction model. The adaptation unit 32 compares a measured deposition thickness of the α-Si and an estimated deposition thickness (obtained by multiplying the deposition time to the predicted deposition speed), and performs an adaptation process of correcting the relationship between the deposition speed and the process factor in the prediction model by using the comparison difference or result. The prediction unit 31 receives the process factors that are measured during the deposition process from the PECVD equipment 1. The adaptation unit 32 receives the measured deposition thickness from the thickness ellipsometer 2.

For the prediction model according to aspects of the present invention, the PT, Vpp, and TUNE are established as independent parameters, and the correlations between the independent parameters and the deposition thickness are reflected in the prediction model. One of various types of models can be selected or used as the prediction model in order to determine the correlations between the independent parameters and the deposition thickness. In more detail, a linear/non-linear regression model or a neural network model can be selected as the prediction model. When the prediction model is selected or used, the complexity of the prediction model in terms of the maintenance and management of the virtual measuring device 3 and the accuracy of the prediction model are to be considered.

In one aspect of the present invention, the linear regression model is used as the prediction model. The linear regression model used as the prediction model can be expressed according to Equation 1 below. However, aspects of the present invention are not limited thereto.

$$\text{THK/PT} = \beta_0 + \beta_1(Vpp) + \beta_2(\text{TUNE}) \qquad \text{Equation 1}$$

In Equation 1, THK/PT denotes the thickness of the α-Si relative to the process time, $\beta_0$, $\beta_1$, and $\beta_2$ denote values that reflect the process characteristic variations, and which vary according to the adaptation process used, and are model parameters.

In order to determine the prediction accuracy of the established, predefined, or selected prediction model of the virtual measuring device 3, a process of model parameter estimation, and results thereof, will now be described.

Figure 2A:
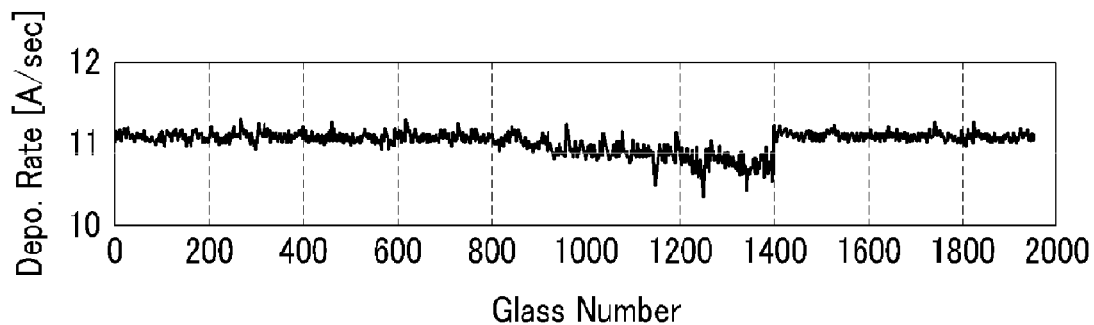
FIGS. 2A-2C are diagrams illustrating a set of input and output data used for model parameter estimation.
Figure 2B:
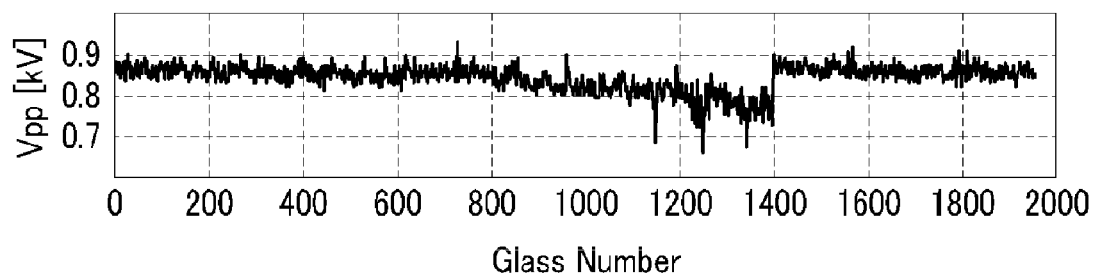
Figure 2C:
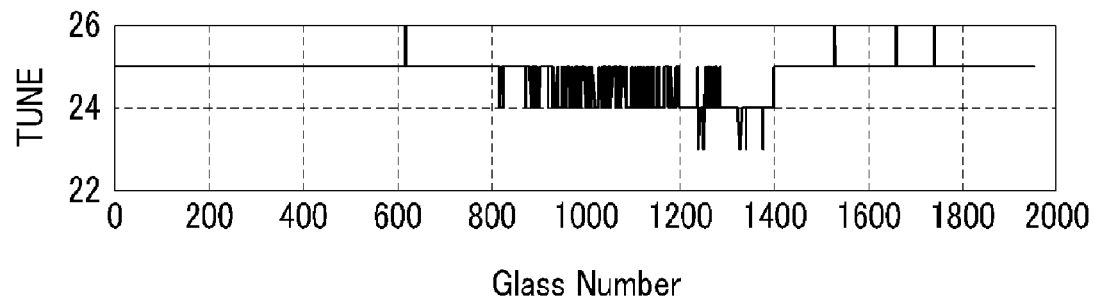

FIGS. 2A-2C show a set of input and output data used for the model parameter estimation. The input data is Vpp and TUNE among the independent parameters. The output data is values of Depo.Rate (deposition rate) obtained by dividing the deposition thickness THK by the process time PT. Referring to FIG. 2A, the first graph shows the relationship between the output data obtained by dividing the deposition thickness THK by the process time PT and the number of glasses for which the process is performed. In FIGS. 2A-2C, the horizontal axis indicates the number of glasses for which the process is performed in the PECVD equipment 1. An increase of the number of glasses corresponds to an elapse of time. In FIG. 2B, the second graph shows the relationship between the Vpp and the number of glasses. In FIG. 2C, the third graphs shows the relationship between the TUNE and the number of glasses. In aspects of the present invention, a glass refers to a formed layer of α-Si, and corresponds to a substrate.

FIG. 3 shows model parameter estimation results of the prediction model according to an aspect of the present invention. As shown in FIG. 3, if referring to the 95% confidence interval (95% CI) for each model parameter among the parameter estimate results of the prediction model by the virtual measuring device 3, it can be seen that the conformity of the prediction model and the set of input and output data is high, and is within ±5% in view of the parameter estimate values, so that the linear regression model is appropriate as the prediction model. However, if the conformity of the prediction model and the set of input and output data is low, the 95% CI of a corresponding model parameter increases, which indicates that a prediction model is not appropriate or accurate. In FIG. 3, a value of the conformity ($R^2$) of the linear regression model is 89.1%, and $S_{Residuals}$ (distribution of prediction residuals) is 0.0420 [Å/sec], which confirms that the prediction (or estimation) accuracy of the prediction model using the model parameter is high. The model parameter estimation of FIG. 3 is based on the input and output data of FIGS. 2A-2C.

Figure 4A:
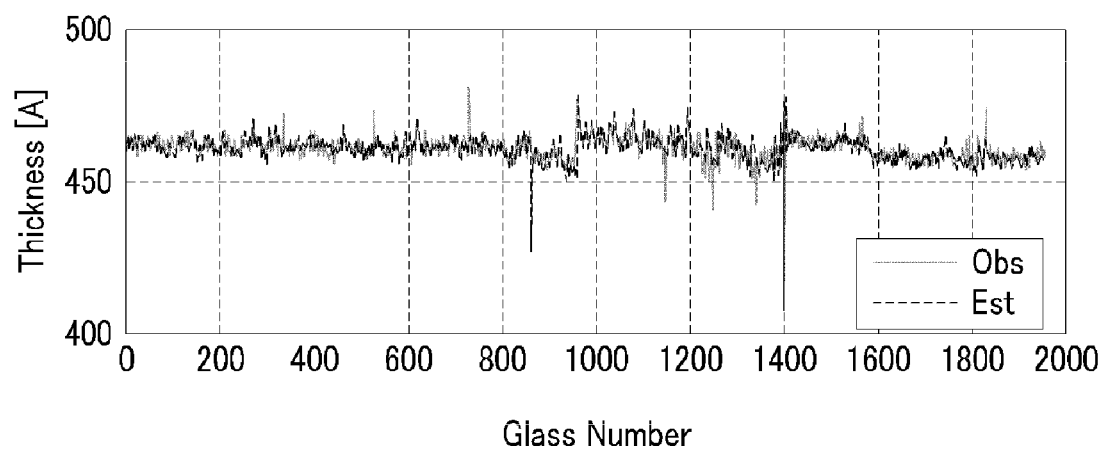
FIG. 4A is a diagram illustrating prediction values of the deposition thickness obtained by a prediction model of a virtual measuring device according to an aspect of the present invention, and measured values of the deposition thickness measured by a thickness ellipsometer.
Figure 4B:
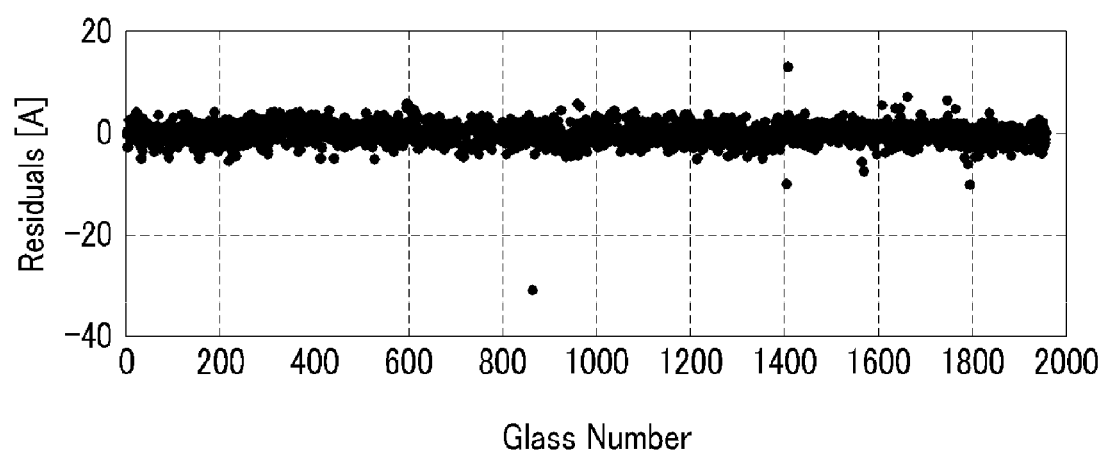
FIG. 4B is a diagram illustrating prediction residuals that are differences between the prediction values and the measured values.

FIG. 4 shows prediction values Est of the deposition thickness obtained by the prediction model of the virtual measuring device 3 according to an aspect of the present invention, actual measured values Obs of the deposition thickness measured by the thickness ellipsometer 2, and prediction residuals that refer to the differences between the prediction values Est and the measured values Obs. The prediction residuals generally have a uniform distribution clustered near 0, except for a few points that are outliers. A few large prediction residuals (e.g., near glass number 850) may indicate the occurrence of errors in measuring the thickness. In the aspect of the present invention, the prediction residuals of the prediction model may be generally within a permissible error range and need not be exactly 0. However, if the process characteristics vary as time elapses and more substrates are processed, the prediction residuals of the prediction model stray beyond the permissible error range.

Figure 5A:
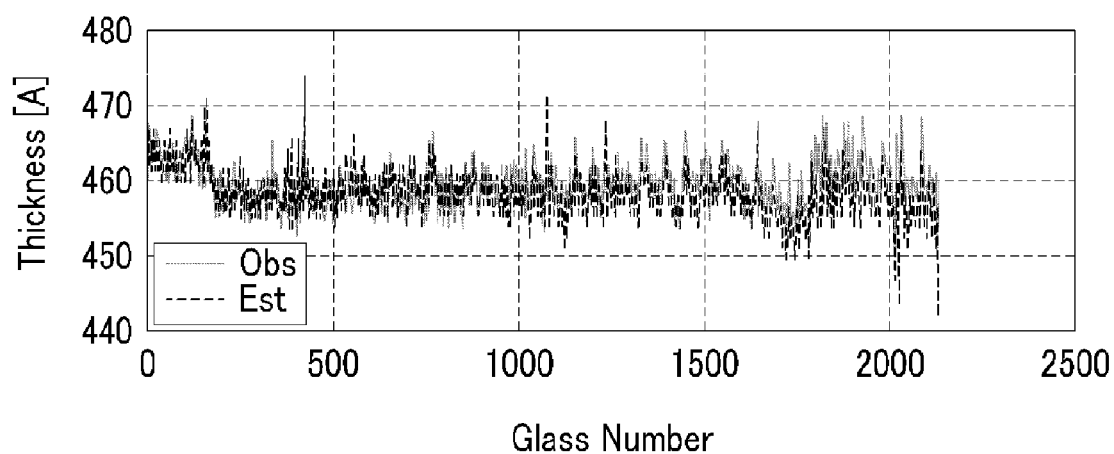
FIG. 5A is a diagram illustrating prediction values of the deposition thickness.
Figure 5B:
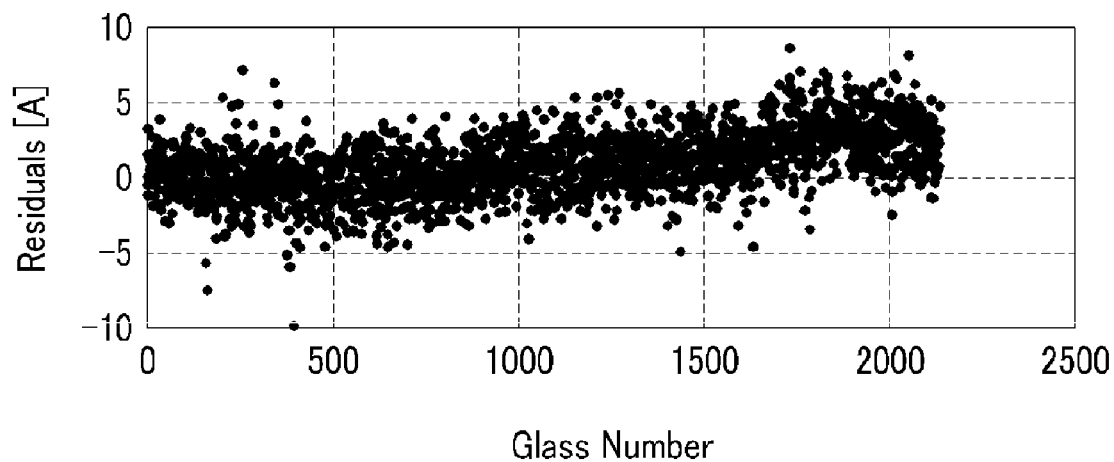
FIG. 5B is a diagram illustrating prediction residuals of the prediction model of a virtual measuring device according to an aspect of the present invention of FIGS. 4A and 4B that are beyond a permissible error range over time.

FIGS. 5A and 5B show two graphs with the measured thickness values Obs, the predicted thickness values Est, and the prediction residuals that stray beyond the permissible error range as time elapses, when the deposition thickness is predicted without reflecting the process characteristic variations over time. In aspects of the present invention, elapse of time is denoted by a number of glasses or substrates that have been processed.

As shown in FIG. 5B, it can be seen that errors gradually increase after approximately a 700-th substrate. Such gradual increase is caused by variations in the process characteristic as time elapses. Thus, it is necessary to adapt (or modify) the prediction model in order to remove the errors that arise from the process characteristic variations over time. Hereinafter, the adaptation (or modification) of the prediction model according to the aspect of the present invention will now be described.

In an aspect of the present invention, the virtual measuring device 3 adapts (or modifies) a prediction result in order to reduce errors caused by the process characteristic variations. First, the virtual measuring device 3 according to the aspect of the present invention uses exponentially weighted moving averages (EWMA) to adapt or modify the prediction model.

In aspects of the present invention, the EWMA includes a term for moving average of deviations that occurred in the prediction model prior to the present prediction (or estimation) of the deviation, and can be expressed by Equations 2 and 3 below. In the aspect of the present invention, the moving average of the deviations can be established as an average of deviations that occurred when a plurality of substrates (e.g., a (k−10)-th substrate to a (k−1)-th substrate) before the deviations of a current prediction substrate (a k-th substrate) are predicted (or estimated).

$$y_k = THK_k + c_{k|k-1} + e_k \qquad \text{Equation 2}$$

In this case, $THK_k = PT_k[\beta_0 + \beta_1(Vpp) + \beta_2(TUNE)]$ denotes the predicted thickness values of the kth substrate, $c_{k|k-1}$ denotes deviations (offsets) of the predicted thickness values and the measured thickness values, and $e_k$ denotes a theoretical error term of the prediction equation. However, since an actual deposition operation reflects errors in the deviations $c_{k|k-1}$ $e_k$ may not actually be used. $y_k$ denotes a deposition thickness value that is corrected by reflecting the deviations and errors in the predicted thickness values through the adaptation process. K denotes a value obtained by counting substrates deposited by the PECVD equipment 1. That is, $y_k$ denotes the deposition thickness value of the k-th substrate corrected through the adaptation process, $c_{k|k-1}$ denotes an estimate value of deviation of the k-th substrate based on deviations of the predicted thickness value and a measured thickness value of a (k−1)-th substrate, which can be expressed by Equation 3 below. $e_k$ denotes an error that have occurred prior to when the deposition thickness of the k-th substrate is predicted.

$$\hat{c}_{k|k-1} = \lambda(\tilde{y}_{k-1} - THK_{k-1|k-2}) + (1-\lambda)\hat{c}_{k-1|k-2} \qquad \text{Equation 3}$$

In this case, $\hat{c}_{k|k-1}$ denotes a statistical estimate value with respect to the deviation $c_{k|k-1}$ in Equation 2, and $\tilde{y}_{k-1}$ denotes a thickness value obtained by measuring the (k−1)-th substrate in the thickness ellipsometer 2. $THK_{k-1|k-2}$ denotes a predicted thickness value of the (k−1)-th substrate. $\hat{c}_{k-1|k-2}$ denotes a statistical estimate value with respect to $c_{k-1|k-2}$. $\lambda$ is tuning parameter of the EWMA in Equation 3, and is selected in consideration of the accuracy and degree of measured noise of the prediction model.

The measured noise is noise that is generated when measuring the deposition thickness, and is the measured error of the thickness ellipsometer 2 in the aspect of the present invention. $\lambda$ may have a value between 0.0 to 1.0 in aspects of the present invention. According to an aspect of the present invention, the $\lambda$ is established (or set) as 0.1 in the virtual measuring device 3, though such is not necessary. Accordingly, the relationship between the deposition thickness and the plurality of process factors are compensated or adjusted according to the comparison difference.

FIGS. 6A to 6H show results obtained by predicting the deposition thickness with regard to different intervals used to measure substrates by the virtual measuring device 3 according to an aspect of the present invention. That is, the interval numbers shown indicate that the deposition thickness of the glass or substrate was measured at each of the noted intervals.

Figure 6A:
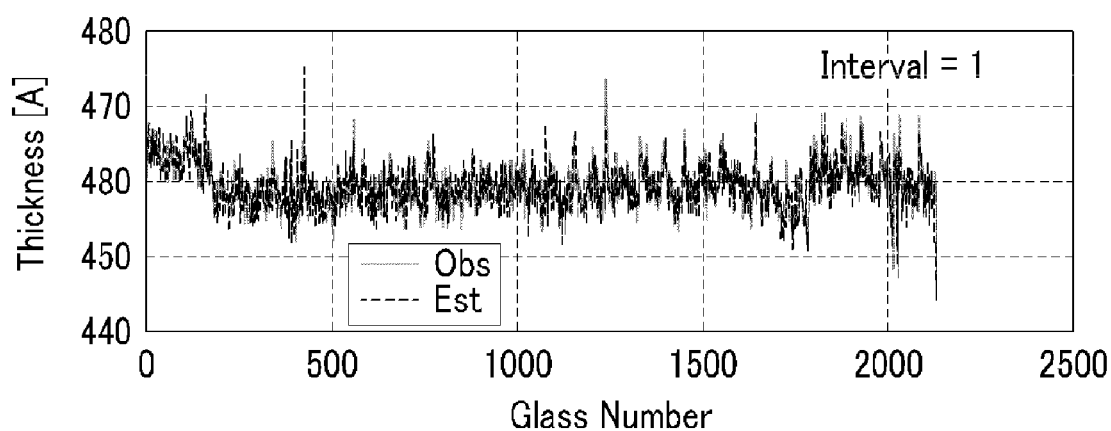
FIGS. 6A to 6H are diagrams illustrating results obtained by predicting the deposition thickness with regard to different intervals used to measure substrates by a virtual measuring device according to an aspect of the present invention.
Figure 6B:
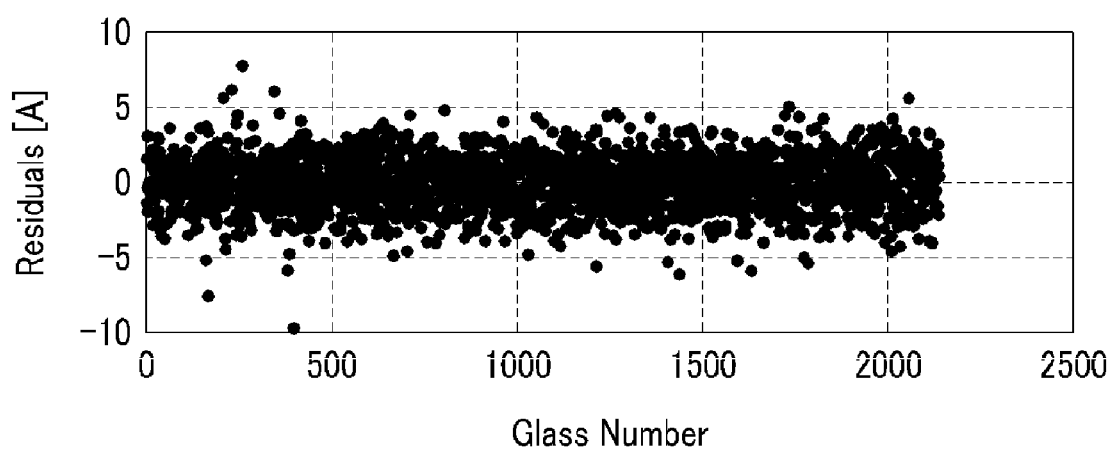
Figure 6C:
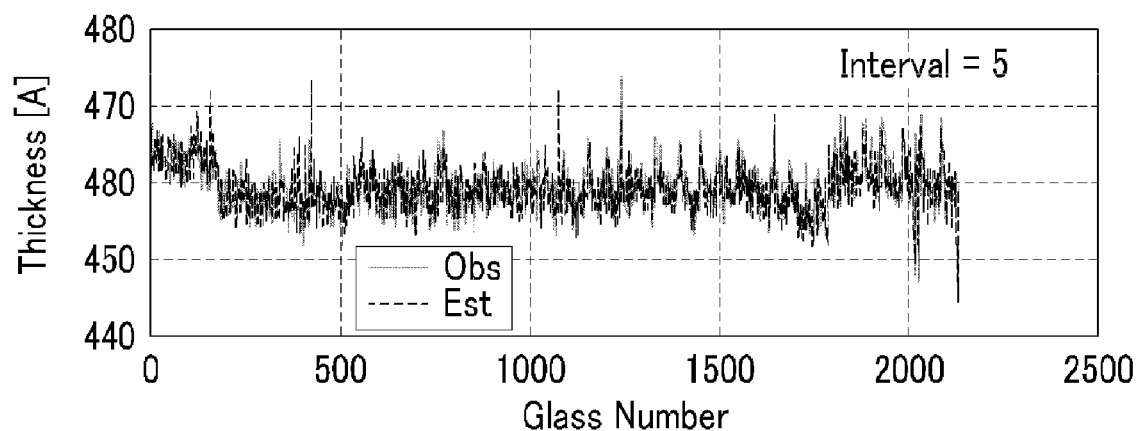
Figure 6D:
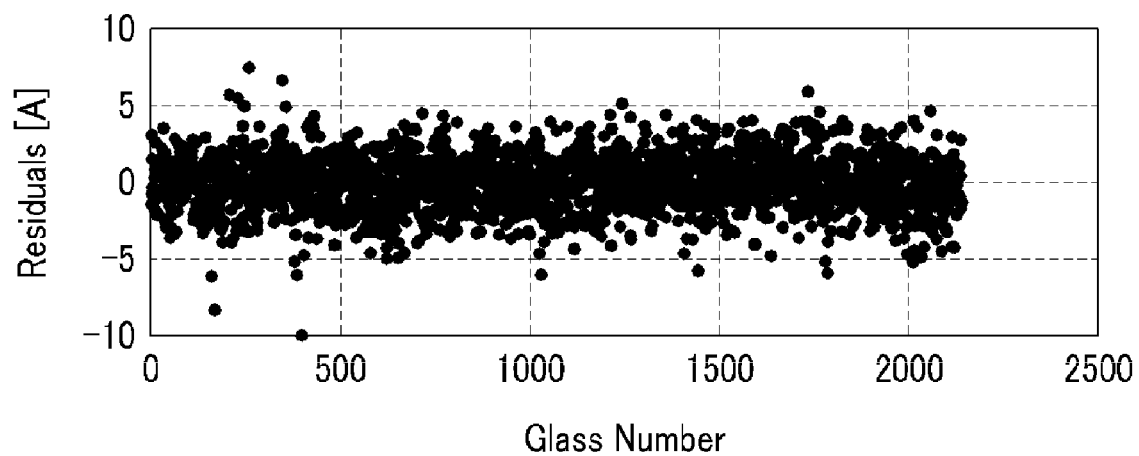
Figure 6E:
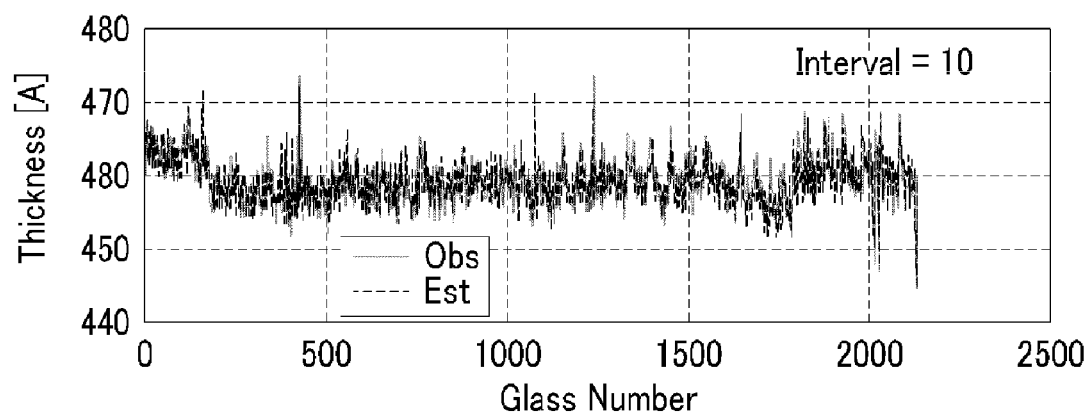
Figure 6F:
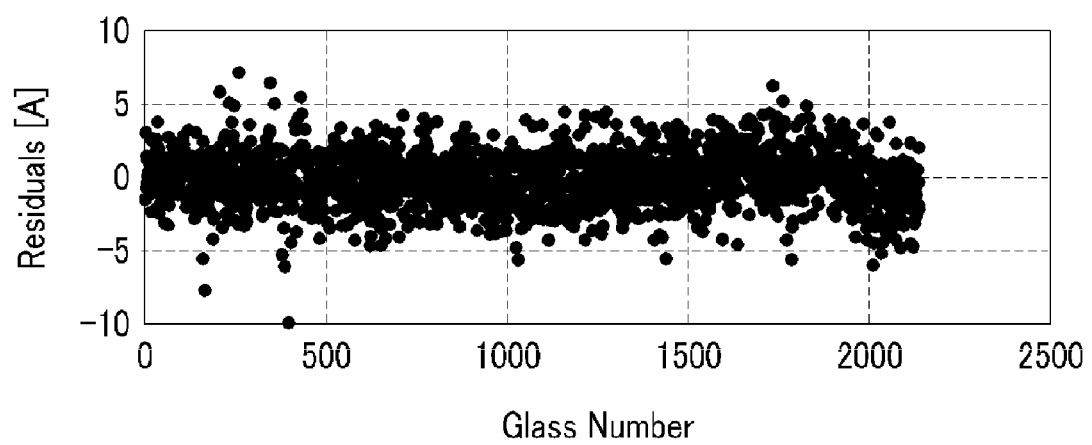
Figure 6G:
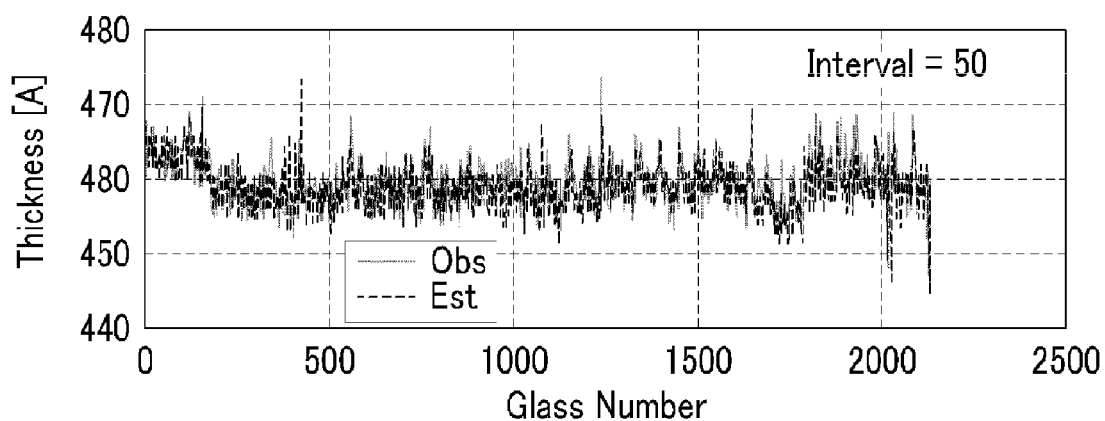
Figure 6H:
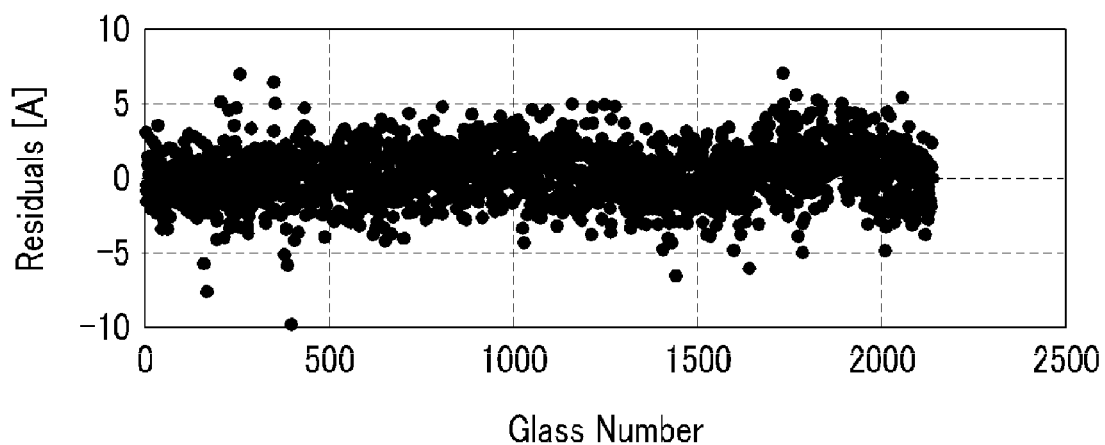

FIGS. 6A and 6B show graphs of a comparison result obtained by measuring the deposition thickness of substrates in a unit of one sheet, correcting expected errors, and predicting the deposition thickness with a result obtained by measuring the deposition thickness. In a thickness graph of FIG. 6A, a course dotted line indicates the prediction results, and a fine dotted line indicates the measurement results. A prediction residuals graph of FIG. 6B indicates a difference between the prediction results and the measurement results.

FIGS. 6C and 6D, 6E and 6F, and 6G and 6H are graphs of comparison results obtained by measuring the deposition thickness of substrates in units of 5, 10, and 50 sheets, respectively, correcting expected errors, and predicting the deposition thickness. Referring to FIGS. 6A to 6H, although the number of the substrates increases, the prediction residuals remain within a predetermined range clustered around 0, unlike those of FIG. 5. That is, the virtual measuring device 3 using the adapted (or modified) prediction model according to the aspect of the present invention can predict or estimate the deposition thickness to which the process characteristic variations over time are reflected.

FIG. 7 shows the thickness prediction distribution of the virtual measuring device 3 according to an aspect of the present invention. The thickness prediction distribution involves values calculated from the prediction residuals shown in FIGS. 6B, 6D, 6F, and 6H, and is the standard deviation of the prediction residuals thereof.

As shown in FIG. 7, when the deposition thickness of substrates is measured in a unit of one sheet and the deposition thickness is predicted, the thickness prediction distribution has the lowest value of 1.4381 Å. When the deposition thickness of substrates is measured in units of 5, 10, and 50 sheets, the thickness prediction distribution has values of 1.4704 Å, 1.4882 Å, and 1.4721 Å, respectively. Thus, the number of units of substrate used to measure the deposition thickness and the thickness prediction distribution are not closely related to each other in the adapted (or modified) prediction model. On the other hand, in a result obtained by predicting the deposition thickness in the virtual measuring device 3 in the prediction model without performing the adaptation process, the thickness prediction distribution has a value of 1.7810 Å for each of the sheet units.

In more detail, as shown in FIGS. 6A-6H, and 7, the virtual measuring device 3 according to another aspect of the present invention can compensate for errors in the prediction model due to variations in the operation (or process) characteristic by performing the adaptation process. Furthermore, although the number of units of sheets of substrates used to measure the deposition thickness is increased in order to compensate for the error, the thickness prediction distribution is low, resulting in excellent prediction performance. Thus, time required to measure the deposition thickness is reduced by not having to measure frequently, thereby reducing time required to predict the deposition thickness. Thus, the virtual measuring device 3 that performs the adaptation process can more accurately predict the deposition thickness in real-time.

Hereinafter, the virtual measuring device 3 according to another aspect of the present invention will now be described. In the previous aspect, although the EWMA is used to perform the adaptation process, the Kalman filter is used to perform the adaptation process in the following aspect of the present invention.

First, the virtual measuring device 3 converts the prediction model into a linear discrete model according to Equations 4 and 5 below in order to apply the Kalman filter.

$$x_{k+1} = A_k x_k + w_k, w_k \sim N(0, Q_k) \quad \text{Equation 4}$$

$$y_k = C_k x_k + v_k, v_k \sim N(0, R_k) \quad \text{Equation 5}$$

In this case, $A_k = \begin{bmatrix} 1 & 0 & 0 \\ 0 & 1 & 0 \\ 0 & 0 & 1 \end{bmatrix}$, and $C_k = PT_k [1 \quad Vpp_k \quad TUNE_k]$.

In Equations 4 and 5, $x_k = [\beta_0 \; \beta_1 \; \beta_2]^T$ and $y_k = THK_k$ denote a status and an output, respectively.

The linear discrete model can be used to configure the Kalman filter of the virtual measuring device 3 according to Equations 6 to 8 below. In this aspect, k denotes the number of substrates that are processed and produced. That is, an increase in k indicates a PT that has elapsed.

$$\hat{x}_{k+1} = A_k \hat{x}_k + A_k K_k [\tilde{y}_k - C_k \hat{x}_k] \quad \text{Equation 6}$$

In this case, $\tilde{y}_k$ denotes a measurement value of the deposition thickness measured by the thickness ellipsometer 2, $\hat{x}_k$ denotes a statistical estimate value of the status $x_k$ of Equation 5, and $\hat{x}_k$ is updated whenever the thickness deposition measured by the thickness ellipsometer 2 is renewed, and $\hat{x}_{k+1}$ denote a statistical estimate value of $X_{K+1}$.

$$K_k = P_k C_k^T [C_k P_k C_k^T + R_k]^{-1} \quad \text{Equation 7}$$

In this case, $K_k$ denotes a Kalman gain. The Kalman gain is used to determine how much a difference between a previous estimate value and a measurement value is reflected to a current estimate value in the adaptation process of compensating for an error with respect to an expected value.

$$P_{k+1} = A_k P_k A_k^T - A_k K_k C_k P_k A_k^T + Q_k \quad \text{Equation 8}$$

In this case, an initial value of the status is defined according to Equations 7 and 8, and is as follows.

$$\hat{x}_{k=0} = \hat{x}_0 \quad \text{Equation 9}$$

In this case, the initial value of the status $\hat{x}_0$ is established using past data or an experimental method.

$$P_{k=0} = E\{[x_0 - \hat{x}_0][x_0 - \hat{x}_0]^T\} \quad \text{Equation 10}$$

$Q_k$, $R_k$, and $P_0$ of Equations 4, 5, and 10 denote tuning parameters of the Kalman filter. In this case, $Q_k$ and $R_k$ denote variances with respect to a status error of the prediction model and measured value noise, respectively. The status error of the prediction model is a value indicating the reliability of a suggested prediction model, and the measured value noise is a value indicating the reliability of the thickness ellipsometer 2.

In an aspect of the present invention, assuming that there is no variation according to time of each tuning parameter, it is, established or set that $$Q_k = 1 \times 10^{-6} \begin{bmatrix} 1 & 0 & 0 \\ 0 & 1 & 0 \\ 0 & 0 & 1 \end{bmatrix}$$

and $$R_k = 1 \times 10^{-2}$$

$$P_0 = \begin{bmatrix} 0.0548^2 & 0 & 0 \\ 0 & 0.0387^2 & 0 \\ 0 & 0 & 0.0025^2 \end{bmatrix}$$

with respect to $k = 1, \ldots, \infty$. In aspects of the present invention, the values in the $P_0$ matrix may be other than those shown.

FIGS. 8A to FIG. 8H show results obtained by predicting the deposition thickness with respect to different intervals used to measure substrates by the virtual measuring device 3 according to another aspect of the present invention.

Figure 8A:
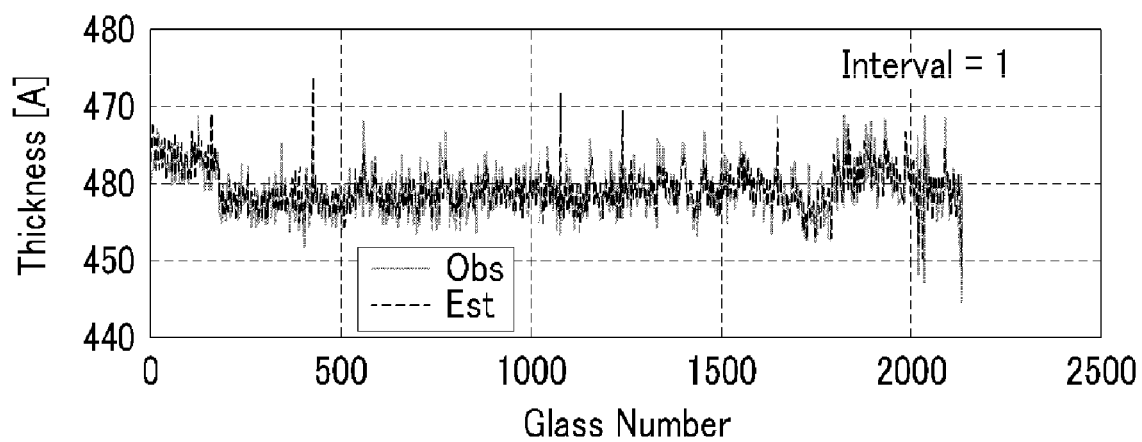
FIGS. 8A to 8H are diagrams illustrating results obtained by predicting the deposition thickness with respect to different intervals used to measure substrates by a virtual measuring device according to another aspect of the present invention.
Figure 8B:
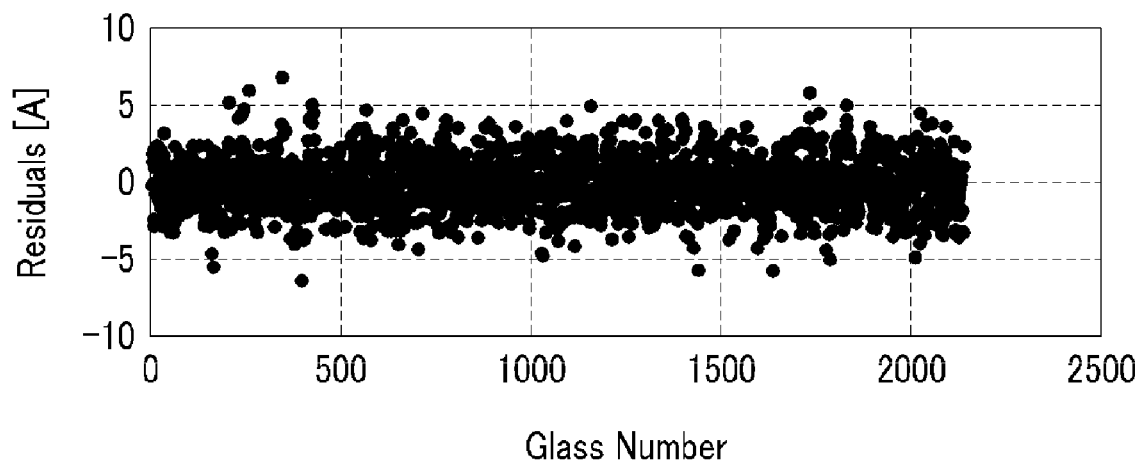
Figure 8C:
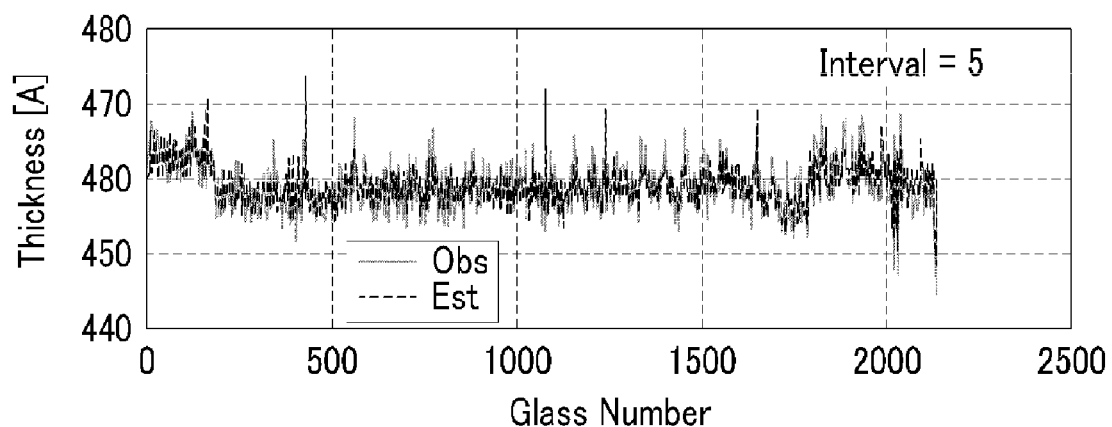
Figure 8D:
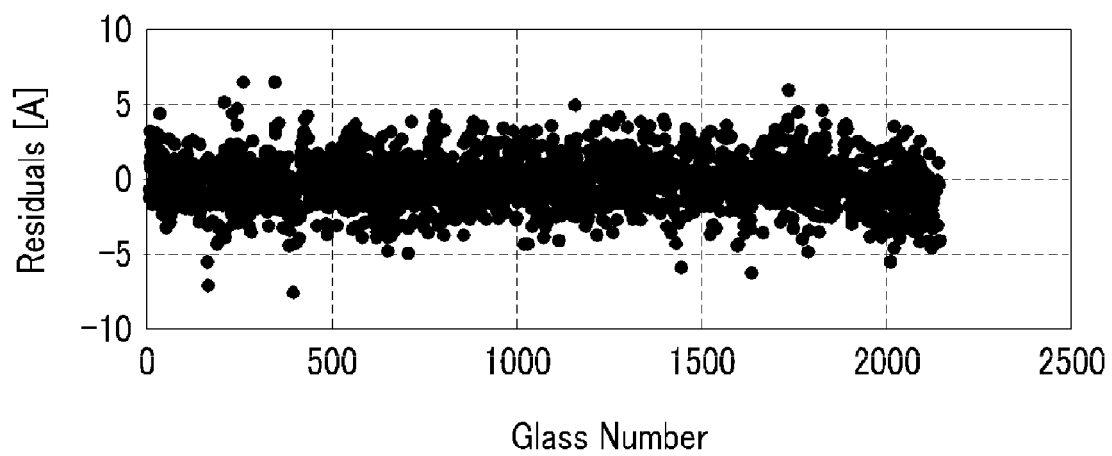
Figure 8E:
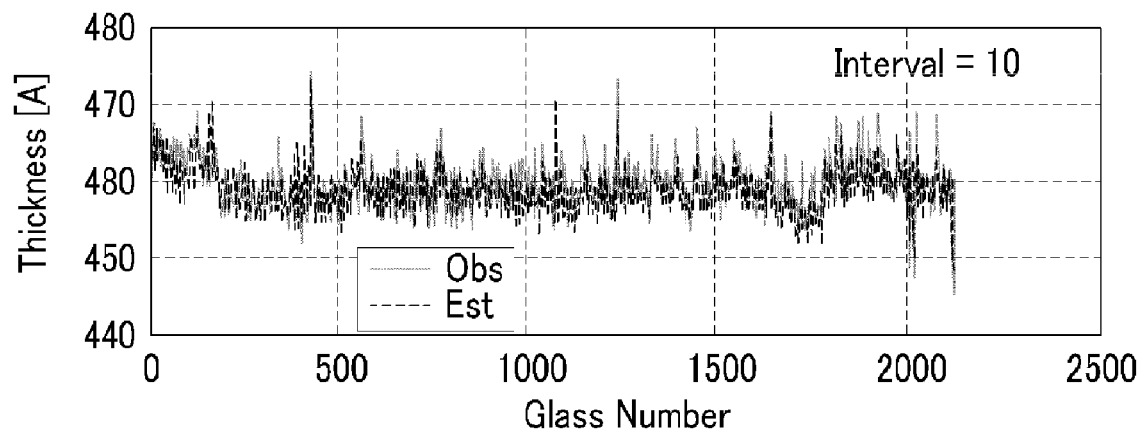
Figure 8F:
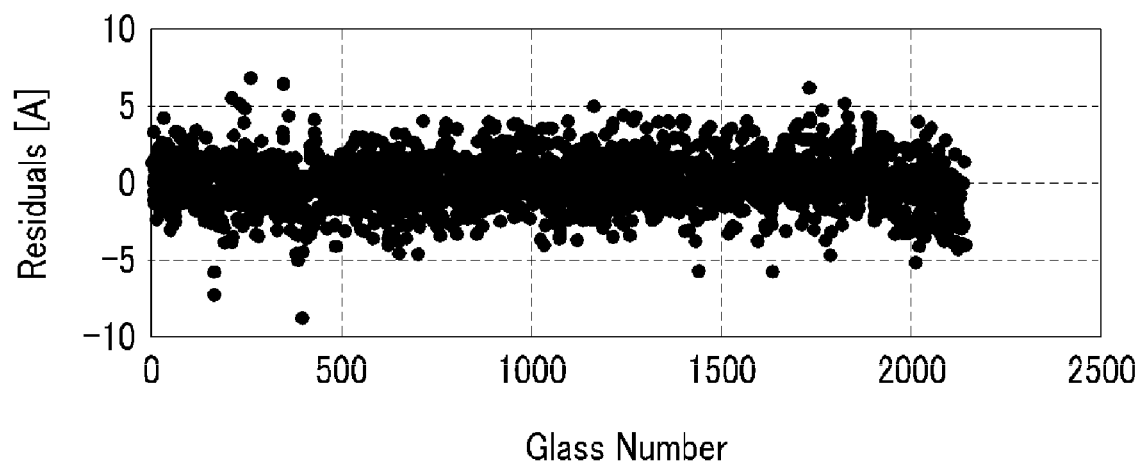
Figure 8G:
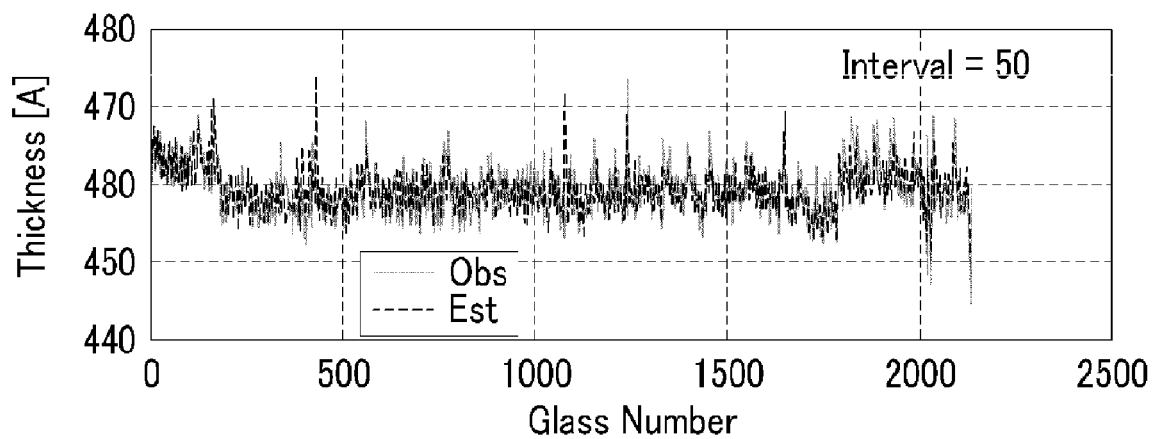
Figure 8H:
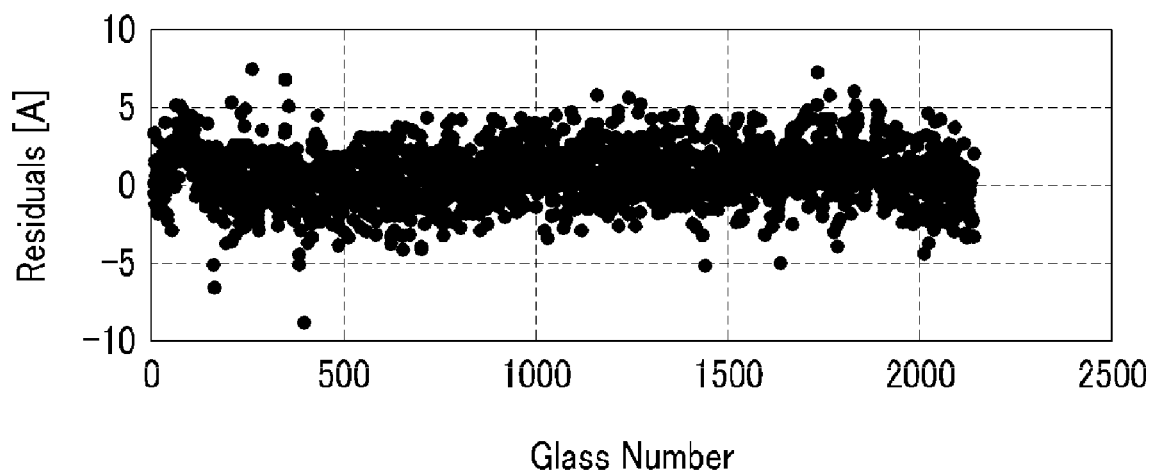

FIGS. 8A and 8B are graphs showing a comparison result obtained by measuring the deposition thickness of substrates in a unit of one sheet, correcting expected errors, and predicting the deposition thickness with a result obtained by measuring the deposition thickness. In the thickness graph of FIG. 8A, a course dotted line indicates the prediction result, and a fine dotted line indicates the measurement result. The prediction residual graph of FIG. 8B indicates a difference between the prediction result and the measurement result.

FIGS. 8C and 8D, 8E and 8F, 8G and 8H are graphs showing a comparison result obtained by measuring the deposition thickness of substrates in units of 5, 10, and 50 sheets, respectively, correcting expected errors, and predicting the deposition thickness with a result obtained by measuring the deposition thickness. As shown in FIGS. 8A to 8H, although the number of substrates increases, the prediction residuals remain within a predetermined range clustered around 0, unlike those in FIG. 5. That is, the virtual measuring device 3 according to this aspect of the present invention can predict the deposition thickness to which the process characteristic variations over time are reflected. Accordingly, the relationship between the deposition thickness and the plurality of process factors are compensated or adjusted according to the comparison difference.

FIG. 9 is a table illustrating the thickness prediction distribution with respect to the prediction result of the deposition thickness shown in FIGS. 8A to 8H. The thickness prediction distribution shows values calculated from the prediction residuals shown in FIGS. 8B, 8D, 8F, and 8H, and is the standard deviation of the prediction residuals.

As shown in FIG. 9, when the deposition thickness of substrates is measured in a unit of one sheet and the deposition thickness is predicted, the thickness prediction distribution has the lowest value of 1.2892 Å. When the deposition thickness of substrates is measured in units of 5, 10, and 50 sheets, the thickness prediction distribution has values of 1.3376 Å, 1.3522 Å, and 1.4253 Å, respectively. In a result obtained by predicting the deposition thickness in the virtual measuring device 3 using the prediction model without performing the adaptation process, the thickness prediction distribution has a value of 1.7810 Å.

In more detail, as shown in FIGS. 8A to 8H and 9, the virtual measuring device 3 including the Kalman filter has a small deviation of the prediction performance according to the measuring intervals, even though the measuring intervals are different from each other. That is, the virtual measuring device 3 is less affected by the measuring intervals. Therefore, the virtual measuring device 3 using the Kalman filter has excellent prediction performance even when the virtual measuring device 3 is applied to a process having irregular measuring intervals.

Furthermore, since the Kalman filter has characteristics for dynamically varying parameters of the prediction model, although the parameters of the prediction model do not have good initial estimate values, such initial estimate values can be supplemented. When the process characteristics vary over time, it is possible to adapt parameters of the prediction model to the process characteristic variations.

Thus, the virtual measuring device 3 according to aspects of the present invention can compensate for an error by performing the adaptation process although the error occurs in the prediction model according to the operation characteristic variations. Although the measuring intervals for the adaptation may increase, the thickness prediction distribution is low, resulting in excellent prediction performance. Thus, time required to measure the deposition thickness is reduced, thereby reducing the time required to predict or estimate the deposition thickness. Thus, the virtual measuring device 3 that performs the adaptation process can accurately predict or estimate the deposition thickness in real-time. Further, the adaptation process counteracts variations in the plurality of process factors that occur over time, namely, the operation characteristic variations.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A method of predicting a deposition thickness of amorphous silicon being deposited on a substrate, the method comprising:

during a process of depositing the amorphous silicon to the substrate, predicting the deposition thickness by using a prediction model expressing a relationship between the deposition thickness and a plurality of process factors that are correlated with the deposition thickness of the amorphous silicon; and after measuring the deposition thickness, and comparing the predicted deposition thickness with the measured deposition thickness, adapting the prediction model to compensate the relationship between the deposition thickness and the plurality of process factors according to the comparison difference, wherein the adapted prediction model is used to predict a deposition thickness during a subsequent process of depositing amorphous silicon, wherein adapting the prediction model uses exponentially weighted moving averages (EWMA) in order to include a moving average of deviations that have occurred in the prediction model, wherein the plurality of process factors include a radio frequency power (RF power) of a deposition apparatus in a process of depositing the amorphous silicon and manufacturing the substrate, a TUNE that is an impedance control factor of a power source that supplies power to the deposition apparatus during the deposition process, and a process time (PT) of the deposition process, and wherein the prediction model is modified by using the exponentially weighted moving averages (EWMA), such that $$y_k = THK_k + c_{k|k-1} + e_k$$

where, $THK_k = PT_k[\beta_0 + \beta_1(Vpp) + \beta_2(TUNE)]$ denotes the estimated deposition thickness of a kth substrate; $\beta_0$, $\beta_1$, and $\beta_2$ denote values that reflect a variation in the process factors over time, $c_{k|k-1}$ denotes a deviation of the estimated deposition thickness of the k-th substrate based on deviations of the estimated deposition thickness, and a measured deposited thickness of a (k−1)-th substrate and the measured deposited thickness; $e_k$ denotes a theoretical error term of the equation; and $y_k$ denotes the modified estimated deposition thickness of the k-th substrate.

2. The method of claim 1, wherein the moving average of deviations is a term for an average of deviations that have occurred in prior predictions of the deposition thickness involving a plurality of substrates before a prediction of the deposition thickness involving a current substrate.

3. A method of predicting a deposition thickness of amorphous silicon being deposited on a substrate, the method comprising:

during a process of depositing the amorphous silicon to the substrate, predicting the deposition thickness by using a prediction model expressing a relationship between the deposition thickness and a plurality of process factors that are correlated with the deposition thickness of the amorphous silicon; and after measuring the deposition thickness, and comparing the predicted deposition thickness with the measured deposition thickness, adapting the prediction model to compensate the relationship between the deposition thickness and the plurality of process factors according to the comparison difference, wherein the adapted prediction model is used to predict a deposition thickness during a subsequent process of depositing amorphous silicon, wherein adapting the prediction model uses a Kalman filter wherein the plurality of process factors include a radio frequency power (RF power Vpp) of the deposition apparatus in depositing the amorphous silicon and manufacturing the substrate, a TUNE that is an impedance control factor of a power source that supplies power to the deposition apparatus during the deposition process, and a process time (PT) of the deposition process, and wherein the prediction model is modified by using a Kalman filter, such that $$\hat{x}_{k+1} = A_k \hat{x}_k + A_k K_k [\tilde{y}_k - C_k \hat{x}_k],$$

where, $\tilde{y}_k$ denotes the measured deposited thickness, $\hat{x}_k$ denotes a statistical estimate value of the status $x_k = [\beta_0\ \beta_1\ \beta_2]^T$, $\hat{x}_{k+1}$ denote a statistical estimate value of $X_{k+1}$;

$$C_k = PT_k[\,1 \quad Vpp_k \quad TUNE_k\,], A_k = \begin{bmatrix} 1 & 0 & 0 \\ 0 & 1 & 0 \\ 0 & 0 & 1 \end{bmatrix};$$

and $K_k$ denotes a Kalman gain.

4. The method of claim 3, wherein the Kalman filter is used by converting the prediction model into a linear discrete model.

5. A virtual measuring device to predict a deposition thickness of amorphous silicon being deposited on a substrate, comprising:
   a prediction unit to predict the deposition thickness of the amorphous silicon being deposited to the substrate by using a prediction model expressing a relationship between the deposition thickness of the amorphous silicon and a plurality of process factors that are correlated with the deposition thickness of the amorphous silicon; and
   an adaptation unit to adapt the prediction model to compensate the relationship between the deposition thickness and the plurality of process factors according to the comparison difference, after comparing a measured deposition thickness with the predicted deposition thickness, wherein the adapted prediction model is used to predict a deposition thickness during a subsequent process of depositing amorphous silicon,
   wherein, in adapting the prediction model, the adaptation unit uses exponentially weighted moving averages (EWMA) in order to include a moving average of deviations that have occurred in the prediction model,
   wherein the plurality of process factors include a radio frequency power (RF power) of a deposition apparatus in a process of depositing the amorphous silicon and manufacturing the substrate, a TUNE that is an impedance control factor of a power source that supplies power to the deposition apparatus during the deposition process, and a process time (PT) of the deposition process, and
   wherein the prediction model is modified by using the exponentially weighted moving averages (EWMA), such that $$y_k = THK_k + c_{k|k-1} + e_k$$

where, $THK_k = PT_k[\beta_0 + \beta_1(Vpp) + \beta_2(TUNE)]$ denotes the estimated deposition thickness of a kth substrate; $\beta_0$, $\beta_1$, and $\beta_2$ denote values that reflect a variation in the process factors over time, $c_{k|k-1}$ denotes a deviation of the estimated deposition thickness of the k-th substrate based on deviations of the estimated deposition thickness, and a measured deposited thickness of a (k−1)-th substrate and the measured deposited thickness; $e_k$ denotes a theoretical error term of the equation; and $y_k$ denotes the modified estimated deposition thickness of the k-th substrate.

6. The virtual measuring device of claim 5, wherein the moving average of deviations is a term for an average of deviations that have occurred in prior predictions of the deposition thickness involving a plurality of substrates before a prediction of the deposition thickness involving a current substrate.

7. A virtual measuring device to predict a deposition thickness of amorphous silicon being deposited on a substrate, comprising:
   a prediction unit to predict the deposition thickness of the amorphous silicon being deposited to the substrate by using a prediction model expressing a relationship between the deposition thickness of the amorphous silicon and a plurality of process factors that are correlated with the deposition thickness of the amorphous silicon; and
   an adaptation unit to adapt the prediction model to compensate the relationship between the deposition thickness and the plurality of process factors according to the comparison difference, after comparing a measured deposition thickness with the predicted deposition thickness, wherein the adapted prediction model is used to predict a deposition thickness during a subsequent process of depositing amorphous silicon,
   wherein the adaptation unit uses a Kalman filter in adapting the prediction model, and
   wherein the plurality of process factors include a radio frequency power (RF power Vpp) of the deposition apparatus in depositing the amorphous silicon and manufacturing the substrate, a TUNE that is an impedance control factor of a power source that supplies power to the deposition apparatus during the deposition process, and a process time (PT) of the deposition process, and
   wherein prediction model is modified by using a Kalman filter, such that $$\hat{x}_{k+1} = A_k \hat{x}_k + A_k K_k [\tilde{y}_k - C_k \hat{x}_k],$$

where, $\tilde{y}_k$ denotes the measured deposited thickness, $\hat{x}_k$ denotes a statistical estimate value of the status $x_k = [\beta_0 \ \beta_1 \ \beta_2]^T$, $\hat{x}_{k+1}$ denote a statistical estimate value of $X_{K+1}$;

$$C_k = PT_k[\,1 \quad Vpp_k \quad TUNE_k\,], A_k = \begin{bmatrix} 1 & 0 & 0 \\ 0 & 1 & 0 \\ 0 & 0 & 1 \end{bmatrix};$$

and $K_k$ denotes a Kalman gain.

8. The virtual measuring device of claim 7, wherein the adaptation unit converts the prediction model into a linear discrete model and uses the Kalman filter.

9. A method of modeling a deposition thickness of amorphous silicon being deposited on a substrate in real time, the method comprising:
   estimating a deposition thickness of the amorphous silicon being deposited on the substrate by using an equation expressing a relationship between the deposition thickness and a plurality of process factors of a deposition apparatus used during the deposition of the amorphous silicon;
   measuring a deposited thickness of the amorphous silicon over a designated sheet interval and comparing the measured deposited thickness with the estimated deposition thickness to generate a difference data; and
   modifying the equation with additional terms for the equation based on the generated difference data so that subsequent difference data is within a predetermined range, wherein:
   the plurality of process factors include a radio frequency power (RF power Vpp) of the deposition apparatus in depositing the amorphous silicon and manufacturing the substrate, a TUNE that is an impedance control factor of a power source that supplies power to the deposition apparatus during the deposition process, and a process time (PT) of the deposition process, and
   the equation is modified by using exponentially weighted moving averages (EWMA), such that $$y_k = THK_k + c_{k|k-1} + e_k,$$

where, $THK_k=PT_k[\beta_0+\beta_1(Vpp)+\beta_2(TUNE)]$ denotes the estimated deposition thickness of a kth substrate; $\beta_0$, $\beta_1$, and $\beta_2$ denote values that reflect a variation in the process factors over time, $c_{k|k-1}$ denotes a deviation of the estimated deposition thickness of the k-th substrate based on deviations of the estimated deposition thickness, and a measured deposited thickness of a (k−1)-th substrate and the measured deposited thickness; $e_k$ denotes a theoretical error term of the equation; and $y_k$ denotes the modified estimated deposition thickness of the k-th substrate.

10. A method of modeling a deposition thickness of amorphous silicon being deposited on a substrate in real time, the method comprising:
  estimating a deposition thickness of the amorphous silicon being deposited on the substrate by using an equation expressing a relationship between the deposition thickness and a plurality of process factors of a deposition apparatus used during the deposition of the amorphous silicon;
  measuring a deposited thickness of the amorphous silicon over a designated sheet interval and comparing the measured deposited thickness with the estimated deposition thickness to generate a difference data; and
  modifying the equation with additional terms for the equation based on the generated difference data so that subsequent difference data is within a predetermined range, wherein:
  the plurality of process factors include a radio frequency power (RF power Vpp) of the deposition apparatus in depositing the amorphous silicon and manufacturing the substrate, a TUNE that is an impedance control factor of a power source that supplies power to the deposition apparatus during the deposition process, and a process time (PT) of the deposition process, and
  the equation is modified by using a Kalman filter, such that $$\hat{x}_{k+1}=A_k\hat{x}_k+A_kK_k[\tilde{y}_k-C_k\hat{x}_k],$$

where, $\tilde{y}_k$ denotes the measured deposited thickness, $\hat{x}_k$ denotes a statistical estimate value of the status $x_k=[\beta_0\ \beta_1\ \beta_2]^T$, $\hat{x}_{k+1}$ denote a statistical estimate value of $X_{K+1}$;

$$C_k = PT_k[1\ \ Vpp_k\ \ TUNE_k],\ A_k = \begin{bmatrix}1 & 0 & 0\\0 & 1 & 0\\0 & 0 & 1\end{bmatrix};$$

and $K_k$ denotes a Kalman gain.

11. An apparatus to model a deposition thickness of amorphous silicon being deposited on a substrate in real time, the apparatus comprising:
  a predictor to estimate a deposition thickness of the amorphous silicon being deposited on the substrate by using an equation expressing a relationship between the deposition thickness and a plurality of process factors of a deposition apparatus used during the deposition of the amorphous silicon;
  a measurer to measure a deposited thickness of the amorphous silicon over a designated sheet interval for use in comparing the measured deposited thickness with the estimated deposition thickness to generate a difference data; and
  an adapter to modify the equation with additional terms for the equation based on the generated difference data so that subsequent difference data is within a predetermined range, wherein:
  the plurality of process factors include a radio frequency power (RF power Vpp) of the deposition apparatus in depositing the amorphous silicon and manufacturing the substrate, a TUNE that is an impedance control factor of a power source that supplies power to the deposition apparatus during the deposition process, and a process time (PT) of the deposition process, and
  the equation is modified by using exponentially weighted moving averages (EWMA), such that $$y_k=THK_k+c_{k|k-1}+e_k,$$

where, $THK_k=PT_k[\beta_0+\beta_1(Vpp)+\beta_2(TUNE)]$ denotes the estimated deposition thickness of a kth substrate; $\beta_0$, $\beta_1$, and $\beta_2$ denote values that reflect a variation in the process factors over time, $c_{k|k-1}$ denotes a deviation of the estimated deposition thickness of the k-th substrate based on deviations of the estimated deposition thickness, and a measured deposited thickness of a (k−1)-th substrate and the measured deposited thickness; $e_k$ denotes a theoretical error term of the equation; and $y_k$ denotes the modified estimated deposition thickness of the k-th substrate.

12. An apparatus to model a deposition thickness of amorphous silicon being deposited on a substrate in real time, the apparatus comprising:
  a predictor to estimate a deposition thickness of the amorphous silicon being deposited on the substrate by using an equation expressing a relationship between the deposition thickness and a plurality of process factors of a deposition apparatus used during the deposition of the amorphous silicon;
  a measurer to measure a deposited thickness of the amorphous silicon over a designated sheet interval for use in comparing the measured deposited thickness with the estimated deposition thickness to generate a difference data; and
  an adapter to modify the equation with additional terms for the equation based on the generated difference data so that subsequent difference data is within a predetermined range, wherein:
  the plurality of process factors include a radio frequency power (RF power Vpp) of the deposition apparatus in depositing the amorphous silicon and manufacturing the substrate, a TUNE that is an impedance control factor of a power source that supplies power to the deposition apparatus during the deposition process, and a process time (PT) of the deposition process, and
  the equation is modified by using a Kalman filter, such that $$\hat{x}_{k+1}=A_k\hat{x}_k+A_kK_k[\tilde{y}_k-C_k\hat{x}_k],$$

where, $\tilde{y}_k$ denotes the measured deposited thickness, $\hat{x}_k$ denotes a statistical estimate value of the status $x_k=[\beta_0\ \beta_1\ \beta_2]^T$, $\hat{x}_{k+1}$ denote a statistical estimate value of $X_{K+1}$;

$$C_k = PT_k[1\ \ Vpp_k\ \ TUNE_k],\ A_k = \begin{bmatrix}1 & 0 & 0\\0 & 1 & 0\\0 & 0 & 1\end{bmatrix};$$

and $K_k$ denotes a Kalman gain.

* * * * *